United States Patent
Qin et al.

(10) Patent No.: US 9,484,360 B2
(45) Date of Patent: Nov. 1, 2016

(54) METHOD FOR MANUFACTURING OXIDE THIN FILM TRANSISTOR (TFT) ARRAY SUBSTRATE

(71) Applicant: BOE TECHNOLOGY GROUP CO., LTD., Beijing (CN)

(72) Inventors: Wei Qin, Beijing (CN); Xiang Liu, Beijing (CN); Heecheol Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/435,110

(22) PCT Filed: Aug. 29, 2014

(86) PCT No.: PCT/CN2014/085503
§ 371 (c)(1),
(2) Date: Apr. 10, 2015

(87) PCT Pub. No.: WO2015/143839
PCT Pub. Date: Oct. 1, 2015

(65) Prior Publication Data
US 2015/0348996 A1    Dec. 3, 2015

(30) Foreign Application Priority Data

Mar. 24, 2014   (CN) .......................... 2014 1 0112458

(51) Int. Cl.
*H01L 27/12*   (2006.01)
*H01L 29/66*   (2006.01)
(Continued)

(52) U.S. Cl.
CPC ......... *H01L 27/1214* (2013.01); *H01L 27/127* (2013.01); *H01L 27/1259* (2013.01);
(Continued)

(58) Field of Classification Search
CPC .................... H01L 2021/775; H01L 27/1214; H01L 27/1251; H01L 27/3262; H01L 29/4908; H01L 51/0508; H01L 2924/13069; H01L 27/3274; H01L 29/24; H01L 29/7869; H01L 29/66969
USPC ............... 257/13, 53, 79, 83, 113, 184, 228; 438/24, 27, 29, 94, 104, 116
See application file for complete search history.

(56) References Cited

U.S. PATENT DOCUMENTS

2010/0304528 A1   12/2010   Kim et al.
2011/0147740 A1*   6/2011   Jeong ................ H01L 29/78606
                                                                257/43
(Continued)

FOREIGN PATENT DOCUMENTS

CN   102122620 A   7/2011
CN   102543754 A   7/2012
(Continued)

OTHER PUBLICATIONS

First Office Action regarding Chinese Application No. 201410112458.6, dated Jan. 21, 2016. Translation provided by Dragon Intellectual Property Law Firm.
(Continued)

*Primary Examiner* — Jarrett Stark
*Assistant Examiner* — Shahed Ahmed
(74) *Attorney, Agent, or Firm* — Harness, Dickey & Pierce, P.L.C.

(57) ABSTRACT

The present disclosure provides a method for manufacturing an oxide thin film transistor (TFT) array substrate. Specifically the step of forming the thin film transistors may include: forming a pattern of an oxide semiconductor layer on the substrate with photoresist is reserved on the channel regions in the pattern of the oxide semiconductor layer; and forming a source-drain metal layer on the pattern of the oxide semiconductor layer, forming patterns that include source electrodes and drain electrodes by an etching process, and removing the photoresist reserved on the channel regions in the pattern of the oxide semiconductor layer.

21 Claims, 6 Drawing Sheets

(51) Int. Cl.
*H01L 29/786* (2006.01)
*H01L 29/24* (2006.01)
*G02F 1/1368* (2006.01)

(52) U.S. Cl.
CPC .......... *H01L27/1262* (2013.01); *H01L 29/24* (2013.01); *H01L 29/66969* (2013.01); *H01L 29/7869* (2013.01); *G02F 1/1368* (2013.01); *H01L 27/1288* (2013.01)

(56) References Cited

U.S. PATENT DOCUMENTS

2011/0228502 A1* 9/2011 Chen ................ C23C 14/165 361/777
2015/0129868 A1* 5/2015 Kim ................ H01L 21/32134 257/43

FOREIGN PATENT DOCUMENTS

| CN | 102637648 A | 8/2012 |
| CN | 102646715 A | 8/2012 |
| CN | 102723269 A | 10/2012 |
| CN | 103545378 A | 1/2014 |
| CN | 103915379 A | 7/2014 |
| CN | 104091784 A | 10/2014 |

OTHER PUBLICATIONS

Written Opinion of the International Searching Authority for international application No. PCT/CN2014/085503.
Second Chinese Office Action regarding Application No. 201410112458.6 dated Jun. 21, 2016. English translation provided by Dragon Intellectual Property Law Firm.

* cited by examiner

METHOD FOR MANUFACTURING OXIDE THIN FILM TRANSISTOR (TFT) ARRAY SUBSTRATE

CROSS REFERENCE OF RELATED APPLICATIONS

This application is the U.S. national phase of PCT Application No. PCT/CN2014/085503 filed on Aug. 29, 2014, which claims the priority of Chinese patent application No. 201410112458.6 filed on Mar. 24, 2014, the disclosures of which are incorporated in their entirety by reference herein.

TECHNICAL FIELD

The present disclosure relates to a technical field of liquid crystal displaying, and more particular to a method for manufacturing oxide thin film transistor (TFT) array substrate.

BACKGROUND

A Thin Film Transistor Liquid Crystal Display (TFT-LCD) has advantages such as small size, low power consumption and zero radiation, and therefore is prevailing in the market of flat panel display nowadays. The main structure of the TFT-LCD includes an array substrate and a color filter substrate that are oppositely arranged to form a cell, so as to fill a liquid crystal molecule layer between the array substrate and the color filter substrate. The conventional TFT mainly includes an oxide semiconductor TFT (also called oxide TFT) and an amorphous silicon TFT. The oxide TFT is more preferable for manufacturing high-end display products with high resolution (high definition) and high refresh rate (smoother motion graphics), because the oxide TFT has characteristics of greater on-off ratio (i.e. when it is turned on, the current is larger, and the duration for charging is shorter; and when it is turned off, the drain current is smaller, and it is anti-creep).

FIG. 1 is a schematic view of a structure of an oxide TFT array substrate in related art. Herein the oxide TFTs each is of a simple structure of back channel etching (BCE), which includes, from bottom to top, a gate electrode 2, a gate isolation layer 7, a pattern 5 of an oxide semiconductor layer, a source electrode 3, a drain electrode 4, and a protection layer 8 coated thereon, wherein the source electrode 3 and the drain electrode 4 are interfaced with the pattern 5 of the oxide semiconductor layer, and a channel region resides between the source electrode 3 and the drain electrode 4 in the pattern 5 of the oxide semiconductor layer. When the TFTs each is turned on, a conductive channel of the TFT is formed by the channel region in the pattern 5 of the oxide semiconductor layer. Such TFTs are simpler in manufacturing and smaller in size, and a parasitic capacitor therewith is also smaller. However, after forming the pattern 5 of the oxide semiconductor layer, a film is formed by a source-drain metal, and then a photoresist is coated, and the exposing and the developing processes are implemented. When etching the source-drain metal, it is necessary to etch off the source-drain metal between the source electrode 3 and the drain electrode 4, while the etching liquid may significantly corrode the channel region in the pattern 5 of the oxide semiconductor layer. It is proposed a following solution to this problem.

FIG. 2 is a schematic view of another structure of an oxide TFT array substrate in related art. Here the oxide TFT includes, from bottom to top, a gate electrode 2, a gate isolation layer 7, a pattern 5 of an oxide semiconductor layer, a etch stop layer (ESL) 9, via holes of the etch stop layer, a source electrode 3, a drain electrode 4, and a protection layer 8 coated thereon, wherein the source electrode 3 and the drain electrode 4 are interfaced with the pattern 5 of the oxide semiconductor layer by the via holes of the etch stop layer, and a channel region is arranged between the source electrode 3 and the drain electrode 4 in the pattern 5 of the oxide semiconductor layer. When the TFTs each is turned on, a conductive channel of the TFT is formed by the channel region in the pattern 5 of the oxide semiconductor layer. Thus, during the process of forming the source electrode 3 and the drain electrode 4 by an etching process, the etch stop layer 9 may prevent the channel region in the pattern 5 of the oxide semiconductor layer from being etched. However, although such TFTs may prevent the channel region in the pattern 5 of the oxide semiconductor layer from being etched during the process of forming the source electrode 3 and the drain electrode 4, such TFTs are complex in manufacturing and big in size due to the incorporation of the etch stop layer 9. Furthermore, it is introduced a parasitic capacitor between the source electrode 3, the drain electrode 4 and the pattern 5 of the oxide semiconductor layer.

SUMMARY

Technical Problems to be Solved

The present disclosure provides a method for manufacturing an oxide thin film transistor (TFT) array substrate for solving the above technical problem, which may prevent the channel region in the pattern of the oxide semiconductor layer from being etched by the etching liquid, while simplify the forming process during the process of forming the source electrode and the drain electrode of the BCE TFT by etching.

Technical Solutions

For solving the above technical problem, the present disclosure provides a method for manufacturing an oxide thin film transistor (TFT) array substrate, including a step of forming thin film transistors on a substrate, wherein the step of forming the thin film transistors includes:

forming a pattern of an oxide semiconductor layer on the substrate, wherein photoresist is reserved on channel regions in the pattern of the oxide semiconductor layer; and forming a source-drain metal layer on the pattern of the oxide semiconductor layer, forming patterns that include source electrodes and drain electrodes by an etching process, and removing the photoresist reserved on the channel regions in the pattern of the oxide semiconductor layer.

The present disclosure further provides an oxide thin film transistor array substrate manufactured by the above method.

The present disclosure further provides a display apparatus including the above oxide TFT array substrate.

Advantageous Effects

The embodiments of the present disclosure at least achieve the following advantageous effects:

In the above technical solutions, the photoresist reserved on the channel region may prevent the channel region from being etched by the etching liquid for the source-drain metal during the process of forming the patterns of the source electrode and the drain electrode on the pattern of the oxide semiconductor layer, which is implemented by forming the pattern of the oxide semiconductor layer with the photoresist being reserved on the channel region. As a result, the semiconductor characteristics of the TFT may remain being unaffected. Meanwhile, the channel of the TFT is formed by removing the photoresist on the channel region during the process of forming the patterns.

BRIEF DESCRIPTION OF THE DRAWINGS

In order to illustrate the technical solutions of the present disclosure or the related art in a clearer manner, the drawings desired for the embodiments will be described briefly hereinafter. Obviously, the following drawings merely relate to some embodiments of the present disclosure, and based on these drawings, a person skilled in the art may obtain the other drawings without any creative effort.

DETAILED DESCRIPTION

Figure 1:
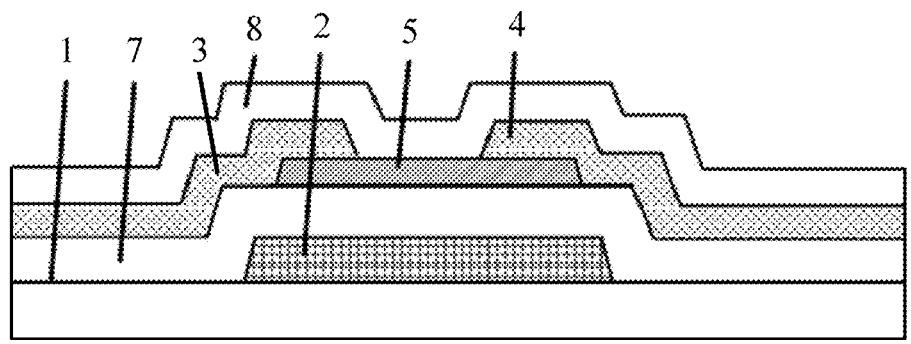
FIG. 1 is a schematic view of a first structure of an oxide TFT array substrate in related art.
Figure 2:
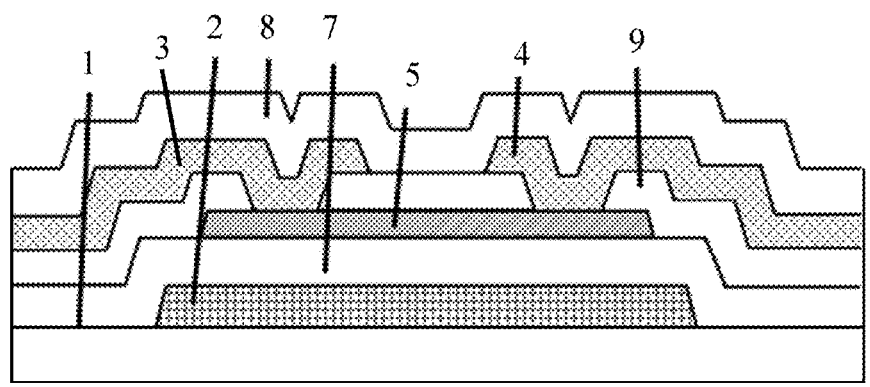
FIG. 2 is a schematic view of a second structure of an oxide TFT array substrate in related art.

The present disclosure will be described hereinafter in conjunction with the drawings and embodiments. The following embodiments are for illustrative purposes only, but shall not be used to limit the scope of the present disclosure.

In order to make the objects, the technical solutions and the advantages of the present disclosure more apparent, some technical solutions of the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

If TFTs of the oxide TFT array substrate are in the structure of BCE in the related art, the source electrodes and the drain electrodes are manufactured (formed by the source-drain metal) after the manufacturing of the pattern of the oxide semiconductor layer. Specifically, the channel region is arranged between the source electrode and the drain electrode in the pattern of the oxide semiconductor layer. When a TFT is turned on, a conductive channel of the TFT is formed by the channel region in the pattern of the oxide semiconductor layer. In such process of manufacturing the source electrodes and the drain electrodes, the etching liquid for the source-drain metal may etch the channel region of the pattern of the oxide semiconductor layer, which affects the semiconductor characteristics of the TFT. With respect to the above technical problem, the present disclosure provides a method for manufacturing the oxide TFT array substrate, wherein the photoresist reserved on the channel region may prevent the channel region from being etched by the etching liquid for the source-drain metal during the process of forming the patterns of the source electrode and the drain electrode in the pattern of the oxide semiconductor layer, which is implemented by forming the pattern of the oxide semiconductor layer with the photoresist being reserved on the channel region. As a result, the semiconductor characteristics of the TFT may remain being unaffected.

Figure 3:
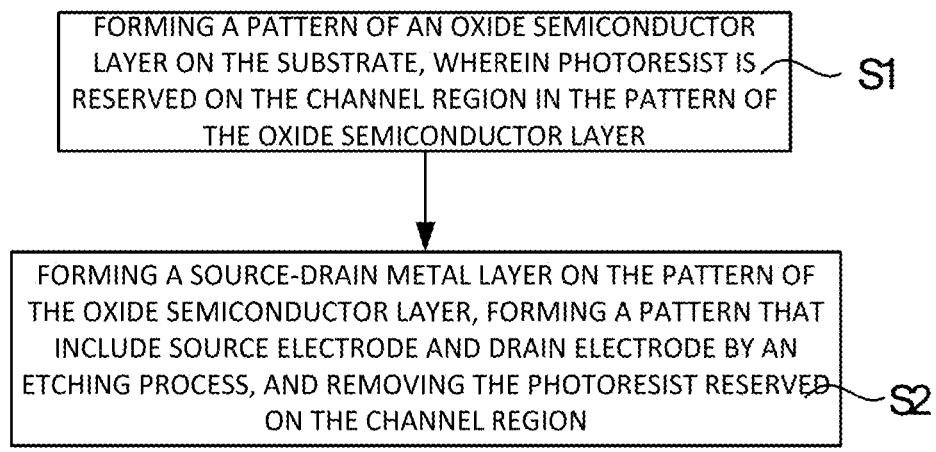
FIG. 3 is a flowchart of a method for manufacturing an oxide TFT array substrate in an embodiment of the present disclosure.

As illustrated in FIG. 3, in an embodiment of the present disclosure, the method for manufacturing the oxide TFT array substrate includes the steps of forming the TFTs on a substrate. Specifically, the steps of forming the TFTs include:

step S1: forming a pattern of an oxide semiconductor layer on the substrate, wherein photoresist is reserved on channel regions in the pattern of the oxide semiconductor layer; and step S2: forming a source-drain metal layer on the pattern of the oxide semiconductor layer, forming patterns that include source electrodes and drain electrodes by an etching process, and removing the photoresist reserved on the channel region in the pattern of the oxide semiconductor layer.

In the above technical solution, the photoresist reserved on the channel region may prevent the channel region from being etched by the etching liquid for the source-drain metal during the process of forming the patterns of the source electrode and the drain electrode in the pattern of the oxide semiconductor layer, which is implemented by forming the pattern of the oxide semiconductor layer with the photoresist being reserved on the channel region. As a result, the semiconductor characteristics of the TFT may remain being unaffected.

The present disclosure will be specifically described hereinafter in conjunction with the drawings and embodiments. The following embodiments are for illustrative purposes only, but shall not be used to limit the scope of the present disclosure.

Figure 4:
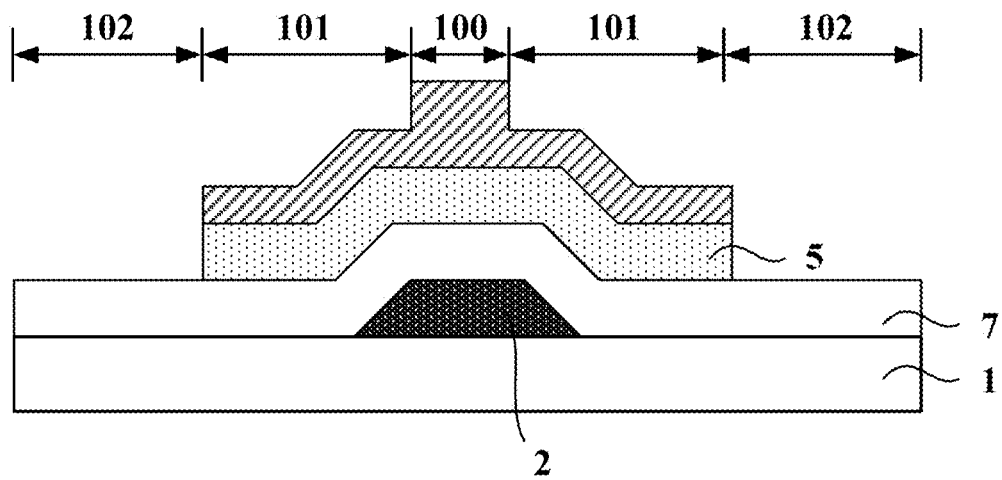
FIG. 4 and FIG. 5 illustrate a process of forming a pattern of the oxide semiconductor layer of the oxide TFT array substrate in an embodiment of the present disclosure.
Figure 5:
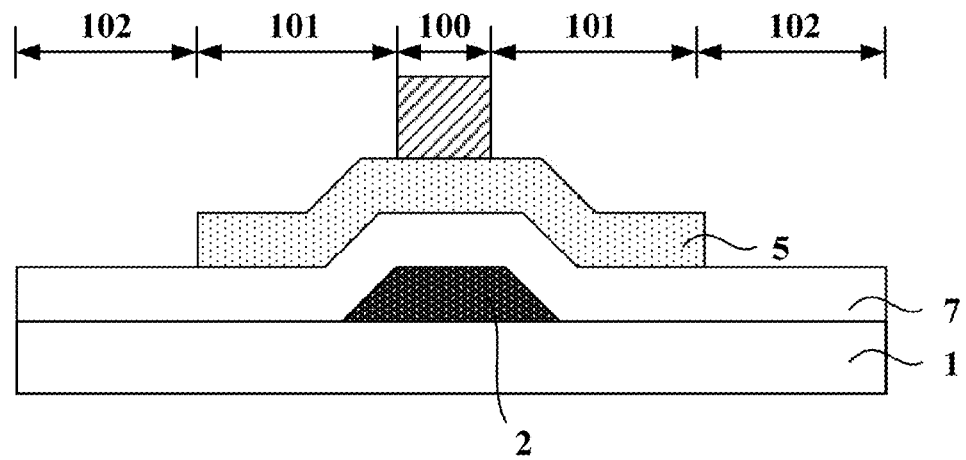

As illustrated in FIG. 4 and FIG. 5, the step of forming a pattern 5 of an oxide semiconductor layer on the substrate 1 with the photoresist being reserved on the channel region specifically includes the following steps.

Step 101: forming the oxide semiconductor layer (not shown) on the substrate 1 (a transparent substrate, such as a glass substrate, a quartz substrate).

The material of the oxide semiconductor layer may be selected from one or more of amorphous Hafnium Indium Zinc Oxide (HIZO), ZnO, TiO2, CdSnO, MgZnO, Indium Gallium Oxide (IGO), Indium Zinc Oxide (IZO), Indium Tin Oxide (ITO) or Indium Gallium Zinc Oxide (IGZO).

In particular, the oxide semiconductor layer may be formed on the substrate 1 by the filming process of, for example, pulsed laser deposition, megnetron sputtering or etc.

Step 102: coating the oxide semiconductor layer with the photoresist.

Step 103: exposing and developing the photoresist with a half tone mask plate or a grey tone mask plate to form a photoresist totally-reserved area 100, a photoresist partially-reserved area 101 and a photoresist unreserved area 102, respectively, as illustrated in FIG. 4. Here, the photoresist totally-reserved area 100 at least corresponds to the channel region in the pattern 5 of the oxide semiconductor layer, the photoresist partially-reserved area 101 at least corresponds to an area other than the channel region in the pattern 5 of the oxide semiconductor layer, and the photoresist unreserved area 102 corresponds to an area other than the pattern 5 of the oxide semiconductor layer.

For example, a thickness of the photoresist in the photoresist totally-reserved area 100 is within a range from 1 μm to 4 μm, and a thickness of the photoresist in the photoresist partially-reserved area 101 is within a range from 0.5 μm to 2 μm. A person skilled in the art may appreciate that the thickness of the photoresist in the photoresist totally-reserved area 100 and the thickness of the photoresist in the photoresist partially-reserved area 101 are not limited to the above examples, which may be appropriately set according to the practical requirement.

Step 104: etching the oxide semiconductor layer in the photoresist unreserved area 102 to form a pattern including the pattern 5 of the oxide semiconductor layer, as illustrated in FIG. 4.

Step 105: removing the photoresist on the photoresist partially-reserved area 101 by a process of, for example ashing, and reserving the photoresist on the photoresist totally-reserved area 100, so as to reserve the photoresist on the channel region in the pattern 5 of the oxide semiconductor layer, as illustrated in FIG. 5.

Here, the principle of the ashing process lies in that, the photoresist is reacted with oxygen in an enclosed oxygen environment and at a predetermined temperature, so as to generate water and carbon dioxide because the photoresist is of organic matter, which is prone to be chemically reacted with the oxygen. The reduction of the thickness of the photoresist may be controlled by precisely controlling, for example, time, temperature and oxygen concentration.

The thickness of the photoresist in the photoresist totally-reserved area 100 is reduced by the ashing process. For example, the thickness of the photoresist in the photoresist totally-reserved area 100 after the ashing process is within a range from 0.5 μm to 2 μm.

It is appreciated that the means for forming a pattern 5 of an oxide semiconductor layer with the photoresist being reserved on the channel region are not limited to the above steps; alternatively, the pattern 5 of the oxide semiconductor layer may be coated with the photoresist after forming the pattern 5 of the oxide semiconductor layer, and only the photoresist on the channel region of the pattern 5 of the oxide semiconductor layer is reserved by the process of exposing and developing.

After forming the pattern 5 of the oxide semiconductor layer with the photoresist being reserved on the channel region, the source electrode and the drain electrode may be formed. As a result, due to the photoresist being reserved on the channel region, the etching liquid may not etch the channel region of the pattern 5 of the oxide semiconductor layer during the etching process for forming the patterns of the source electrode and the drain electrode.

Figure 6:
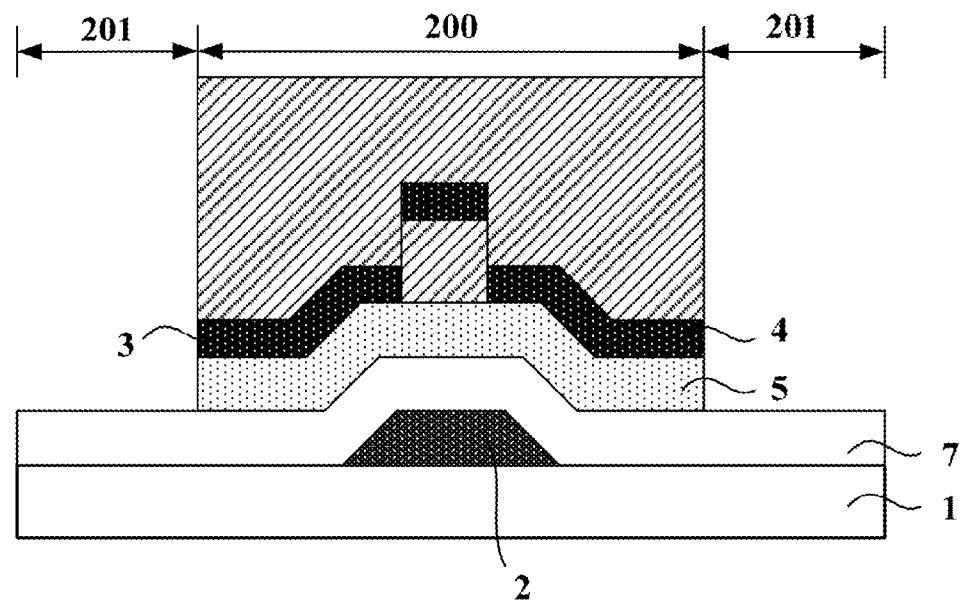
FIG. 6 and FIG. 7 illustrate a first process of forming source electrodes and drain electrodes of the oxide TFT array substrate in an embodiment of the present disclosure.
Figure 7:
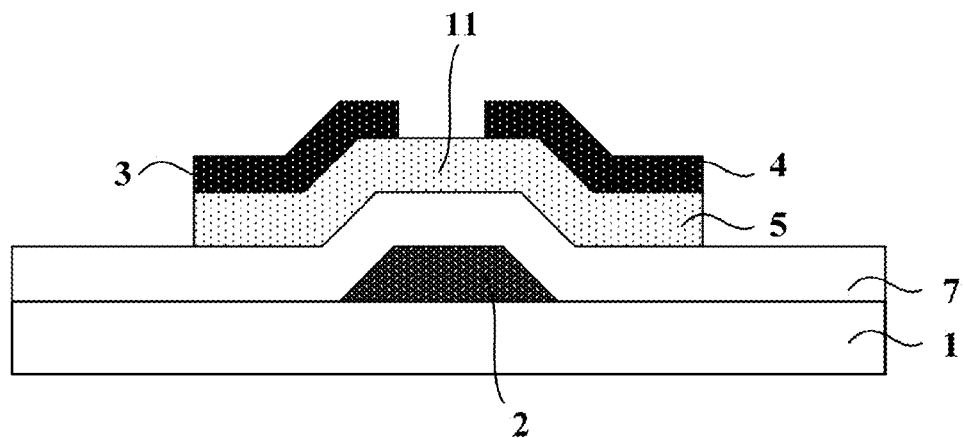

As illustrated in FIG. 6 and FIG. 7, in an embodiment of the present disclosure, the source electrode, the drain electrode and the channel of the TFT may be formed by the following steps, i.e. the step S2 specifically includes the following steps.

Step 201: forming a source-drain metal layer (not shown) on the pattern 5 of the oxide semiconductor layer.

In particular, the source-drain metal layer may be formed by the filming process of, for example, megnetron sputtering, thermal evaporation or etc. The source-drain metal layer may be made of metal such as Cu, Al, Ag, Mo, Cr, Nd, Ni, Mn, Ti, Ta or W, or the alloy of two or more of these metals. The source-drain metal layer may be in a single layer structure or a multi-layer structure, and the multi-layer structure may be of, for example Cu\Mo, Ti\Cu\Ti, Mo\Al\Mo or etc.

Step 202: coating the source-drain metal layer with the photoresist.

Step 203: exposing and developing the photoresist with a conventional mask plate to form a photoresist reserved area 200 and a photoresist unreserved area 201, respectively, as illustrated in FIG. 6. Here the photoresist reserved area 200 at least corresponds to the channel region in the pattern 5 of the oxide semiconductor layer and an area in which the source electrode 3 and the drain electrode 4 are arranged, and the photoresist unreserved area 201 corresponds to other areas.

Step 204: etching off the source-drain metal layer in the photoresist unreserved area 201, as illustrated in FIG. 6.

Step 205: removing the photoresist on the photoresist reserved area 200 and the photoresist being reserved on the channel region in the pattern 5 of the oxide semiconductor layer, so as to form the source electrode 3 and the drain electrode 4, as illustrated in FIG. 7. Here the source electrode 3 and the drain electrode 4 are arranged on the pattern 5 of the oxide semiconductor layer, and the channel region 11 is arranged between the source electrode 3 and the drain electrode 4 in the pattern 5 of the oxide semiconductor layer. When a TFT is turned on, a conductive channel of the TFT is formed by the channel region 11 in the pattern 5 of the oxide semiconductor layer.

Furthermore, the principle of the process of removing the photoresist lies in that the photoresist is melt by an alkaline solution and then is washed off, so that the patterns in other film layers are not affected.

As illustrated in FIGS. 8-11, in another embodiment of the present disclosure, the source electrode, the drain electrode and the channel of the TFT may be formed by the following steps, i.e. the step S2 specifically includes the following steps.

Figure 8:
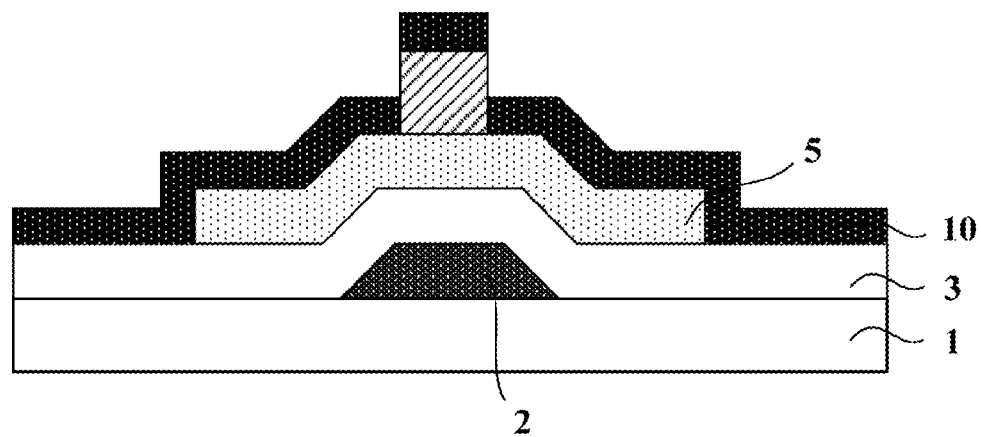
FIGS. 8-11 illustrate a second process of forming source electrodes and drain electrodes of the oxide TFT array substrate in an embodiment of the present disclosure.

Step 301: forming a source-drain metal layer 10 on the pattern 5 of the oxide semiconductor layer, as illustrated in FIG. 8.

Figure 9:
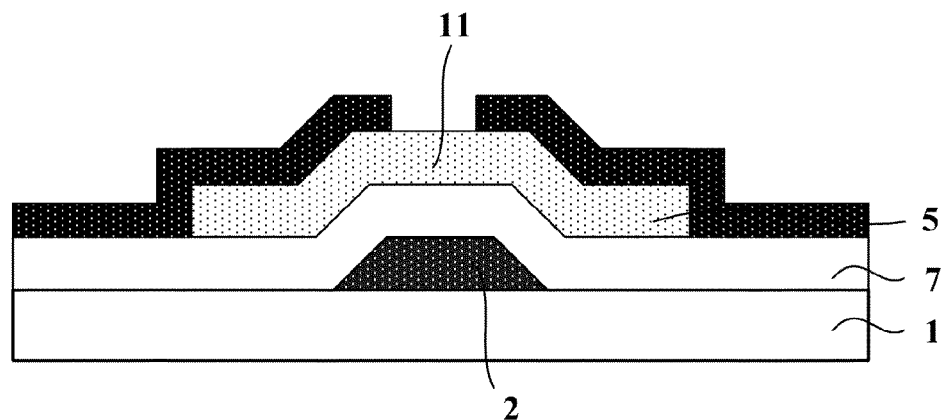

Step 302: removing the photoresist reserved on the channel region of the pattern 5 of the oxide semiconductor layer, so as to form the channel region 11 on the pattern 5 of the oxide semiconductor layer, as illustrated in FIG. 9.

Step 303: coating the source-drain metal layer 10 and the channel region 11 with the photoresist.

Figure 10:
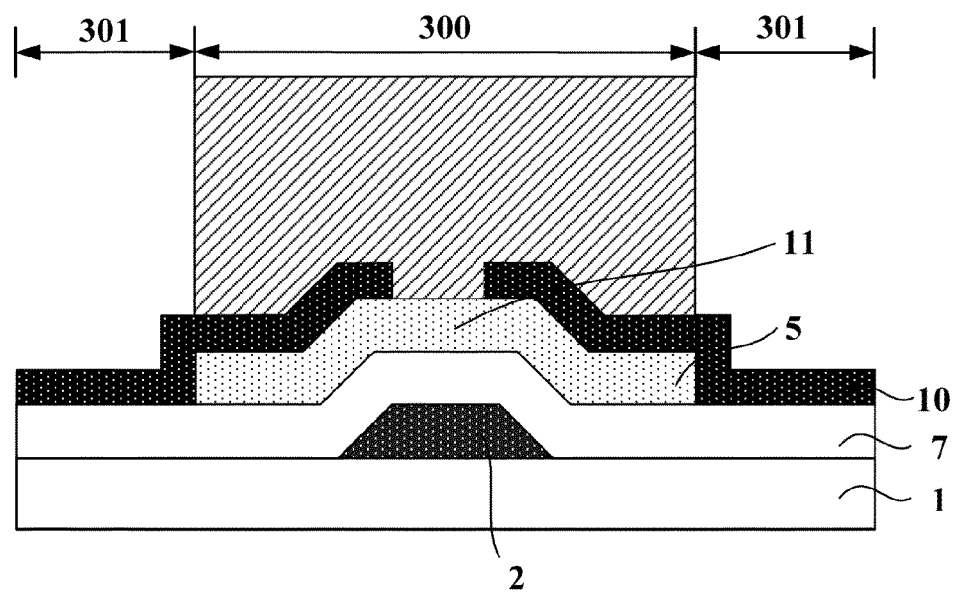

Step 304: exposing and developing the photoresist with a conventional mask plate to respectively form a photoresist reserved area 300 and a photoresist unreserved area 301, as illustrated in FIG. 10. Here the photoresist reserved area 300 at least corresponds to the channel region 11 in the pattern 5 of the oxide semiconductor layer and an area in which the source electrode 3 and the drain electrode 4 are arranged, and the photoresist unreserved area 301 corresponds to other areas.

Figure 11:
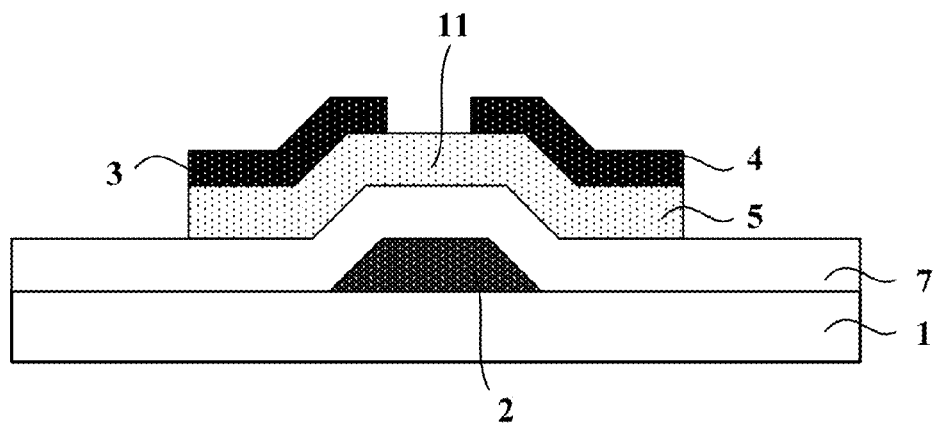

Step 305: etching off the source-drain metal layer in the photoresist unreserved area 301, as illustrated in FIG. 10 and FIG. 11.

Step 306: removing the photoresist on the photoresist reserved area 300 to form the source electrode 3 and the drain electrode 4, as illustrated in FIG. 10 and FIG. 11. The source electrode 3 and the drain electrode 4 are arranged on the pattern 5 of the oxide semiconductor layer, and the channel region 11 is arranged between the source electrode 3 and the drain electrode 4.

In steps 301-306, there are two removing processes, so that the photoresist may be totally removed in the second removing process if the photoresist is merely partially removed in the first removing process in step 302.

In the embodiments of the present disclosure, the photoresist with shorter molecule chains may be adopted to facilitate the removing of the photoresist, so as to avoid the occasion that the photoresist remains after the removing process. Furthermore, the thickness of the photoresist may be increased to prevent the adherence between a position where the photoresist is not required to be removed over the source-drain metal layer 10 and a position where the photoresist is required to be removed over the source-drain metal layer 10 in step 302, and the contact area between the photoresist on a side and the etching liquid is larger, so as to prevent the photoresist being partially remained after the removing process.

In addition to the source electrode, the drain electrode, and the channel between the source electrode and the drain electrode, the TFT may further include a gate electrode and a pixel electrode.

As illustrated in FIG. 4, for a bottom gate TFT array substrate, the method according to the embodiments of the present disclosure may further include the following steps before the step of forming the pattern 5 of the oxide semiconductor layer on the substrate 1.

Step 401: forming a gate electrode 2 on the substrate 1.

Specifically, the gate metal layer (not shown) may be formed on the substrate 1 by a method such as sputtering, thermal evaporation or etc. The gate metal layer may be made of metal such as Cu, Al, Ag, Mo, Cr, Nd, Ni, Mn, Ti, Ta or W, or the alloy of two or more of these metals. The gate metal layer may be in a single layer structure or a multi-layer structure, and the multi-layer structure may be of, for example Cu\Mo, Ti\Cu\Ti, Mo\Al\Mo or etc. Then the gate metal layer is coated with a layer of the photoresist, the photoresist is exposed and developed by the mask plate to respectively form a photoresist unreserved area and a photoresist reserved area. Here, the photoresist reserved area corresponds to an area where the gate electrode 2 is arranged, and the photoresist unreserved area corresponds to other areas. The gate metal layer of the photoresist unreserved area is totally etched off by the etching process, and the remaining photoresist is removed, so that the gate electrode 2 is formed.

Step 402: forming a gate insulating layer 7 over the gate electrode 2.

Specifically, the gate insulating layer 7 may be formed on the substrate 1 with the gate electrode 2 being formed thereon by a method of, for example plasma enhanced chemical vapor deposition (PECVD). Here the gate insulating layer 7 may be made of oxide, nitride or nitrogen oxide. The gate insulating layer 20 may be in a single layer structure, a dual layer structure or a multi-layer structure. Specifically, the gate insulating layer 20 may be made of SiNx, SiOx or Si(ON)x.

Figure 12:
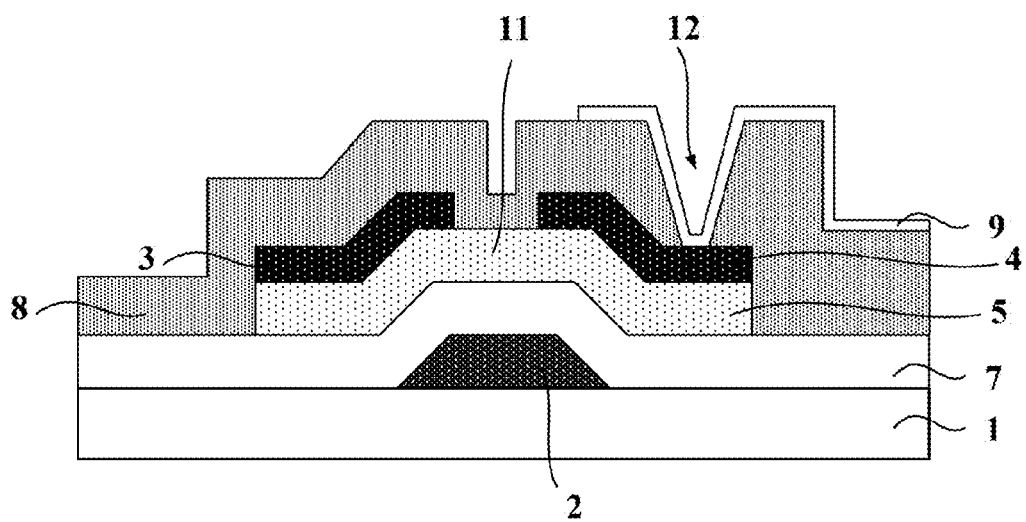
FIG. 12 is a schematic view of a structure of an oxide TFT array substrate in an embodiment of the present disclosure.

As illustrated in FIG. 12, for a bottom gate TFT array substrate, the method according to the embodiments of the present disclosure may further include the following steps after the step of forming the source electrode 3 and the drain electrode 4.

Step 501: forming a passivation layer 8 over the source electrode 3, the drain electrode 4 and the channel regions 11 of the pattern 5 of the oxide semiconductor layer.

In particular, the passivation layer 8 may be formed on the substrate 1 by the filming process of, for example, megnetron sputtering, thermal evaporation, PECVD or etc. Here the passivation layer 8 may be made of oxide, nitride or nitrogen oxide. Specifically, the passivation layer 8 may be made of SiNx, SiOx or Si(ON)x. The passivation layer 8 may be in a single layer structure, or in a dual layer structure made of the silicon nitride and silicon oxide.

Step 502: processing the passivation layer 8 by a patterning process, and forming a pattern of a via hole 12 of the passivation layer over the drain electrode 4.

Specifically, the passivation layer 8 is coated with a layer of the photoresist. The photoresist is exposed and developed by the mask plate to respectively form a photoresist unreserved area and a photoresist reserved area. Here, the photoresist unreserved area corresponds to an area where the via hole 12 of the passivation layer is arranged. The photoresist reserved area corresponds to other areas. The passivation layer of the photoresist unreserved area is totally etched off by the etching process to form the via hole 12 of the passivation layer, and the remaining photoresist is removed.

Step 503: forming a pixel electrode 9 over the passivation layer 8, and the pixel electrode 9 is electrically connected to the drain electrode 4 by the via hole 12 of the passivation layer.

In particular, a transparent and conductive layer may be formed on the passivation layer 8 of the substrate 1 by the filming process of, for example, megnetron sputtering, thermal evaporation or etc. The transparent and conductive layer may be made of, for example ITO or IZO. The transparent and conductive layer may be coated with a layer of the photoresist. The photoresist is exposed and developed by the mask plate to respectively form a photoresist unreserved area and a photoresist reserved area. Here the photoresist reserved area corresponds to an area where the pixel electrode 9 is arranged, and the photoresist unreserved area corresponds to other areas. The transparent and conductive layer of the photoresist unreserved area is totally removed by the etching process, and the remaining photoresist is removed, so that the pixel electrode 9 is formed. The pixel electrode 9 is electrically connected to the drain electrode 4 by the via hole 12 of the passivation layer.

The present disclosure provides a method for manufacturing an oxide TFT array substrate, which may prevent the channel region in the pattern of the oxide semiconductor layer from being etched by the etching liquid, while simplify the manufacturing process during the process of forming the source electrode and the drain electrode of the BCE TFT by etching.

Furthermore, the present disclosure provides an oxide thin film transistor array substrate manufactured by the above method.

Furthermore, the present disclosure provides a display device including the above oxide TFT array substrate.

The above are merely the preferred embodiments of the present disclosure. It should be appreciated that, a person skilled in the art may make further improvements and modifications without departing from the principle of the present disclosure, and these improvements and modifications shall also fall within the scope of the present disclosure.

What is claimed is:

1. A method for manufacturing an oxide thin film transistor (TFT) array substrate, comprising a step of forming thin film transistors on a substrate, wherein the step of forming the thin film transistors comprises:
   forming a pattern of an oxide semiconductor layer on the substrate, wherein photoresist is reserved on channel regions in the pattern of the oxide semiconductor layer; and
   forming a source-drain metal layer on the pattern of the oxide semiconductor layer, forming patterns that include source electrodes and drain electrodes by an etching process, and removing the photoresist reserved on the channel regions in the pattern of the oxide semiconductor layer and a part of the source-drain metal layer formed on the photoresist at the same time.

2. The method according to claim 1, wherein the step of forming a pattern of an oxide semiconductor layer on the substrate comprises:
   forming the oxide semiconductor layer on the substrate;
   coating the oxide semiconductor layer with the photoresist;
   exposing and developing the photoresist to form a photoresist totally-reserved area, a photoresist partially-reserved area and a photoresist unreserved area, respectively;
   etching off the oxide semiconductor layer in the photoresist unreserved area to form a pattern comprising the pattern of the oxide semiconductor layer; and
   removing the photoresist on the photoresist partially-reserved area, and reserving the photoresist on the channel regions in the pattern of the oxide semiconductor layer.

3. The method according to claim 2, wherein the photoresist totally-reserved area at least corresponds to the channel regions in the pattern of the oxide semiconductor layer, the photoresist partially-reserved area at least corresponds to an area other than the channel regions in the pattern of the oxide semiconductor layer, and the photoresist unreserved area corresponds to an area other than the pattern of the oxide semiconductor layer.

4. The method according to claim 2, wherein:
   the photoresist is exposed and developed with a half tone mask plate or a grey tone mask plate; and
   the photoresist on the photoresist partially-reserved area is removed by an ashing process.

5. The method according to claim 1, wherein the step of forming a source-drain metal layer on the pattern of the oxide semiconductor layer, forming patterns that include source electrodes and drain electrodes by an etching process, and removing the photoresist reserved on the channel regions in the pattern of the oxide semiconductor layer comprises:
   forming the source-drain metal layer on the pattern of the oxide semiconductor layer;
   coating the source-drain metal layer with the photoresist;
   exposing and developing the photoresist to form a photoresist reserved area and a photoresist unreserved area, respectively;
   etching off the source-drain metal layer in the photoresist unreserved area; and
   removing the photoresist on the photoresist reserved area and the photoresist being reserved on the channel regions in the pattern of the oxide semiconductor layer, so as to form the source electrodes and the drain electrodes.

6. The method according to claim 5, wherein the photoresist reserved area at least corresponds to the channel regions in the pattern of the oxide semiconductor layer and an area in which the source electrodes and the drain electrodes are arranged, and the photoresist unreserved area corresponds to an area other than the pattern of the oxide semiconductor layer.

7. The method according to claim 1, wherein the step of forming a source-drain metal layer on the pattern of the oxide semiconductor layer, forming patterns that include source electrodes and drain electrodes by an etching process, and removing the photoresist reserved on the channel regions in the pattern of the oxide semiconductor layer comprises:
   forming the source-drain metal layer on the pattern of the oxide semiconductor layer;
   removing the photoresist reserved on the channel regions in the pattern of the oxide semiconductor layer;
   coating the source-drain metal layer and the channel regions in the pattern of the oxide semiconductor layer with the photoresist;
   exposing and developing the photoresist to form a photoresist reserved area and a photoresist unreserved area, respectively;
   etching off the source-drain metal layer in the photoresist unreserved area; and
   removing the photoresist on the photoresist reserved area, so as to form the source electrodes and the drain electrodes.

8. The method according to claim 7, wherein the photoresist reserved area at least corresponds to the channel regions in the pattern of the oxide semiconductor layer and an area in which the source electrodes and the drain electrodes are arranged, and the photoresist unreserved area corresponds to an area other than the pattern of the oxide semiconductor layer.

9. The method according to claim 1, wherein before the step of forming a pattern of an oxide semiconductor layer on the substrate, the method further comprises:
   forming gate electrodes on the substrate; and
   forming a gate insulating layer over the gate electrodes.

10. The method according to claim 1, wherein after the step of forming a source-drain metal layer on the pattern of the oxide semiconductor layer, forming patterns that include source electrodes and drain electrodes by an etching process, and removing the photoresist reserved on the channel regions in the pattern of the oxide semiconductor layer, the method further comprises:
    forming a passivation layer over the source electrodes, the drain electrodes and the channel regions in the pattern of the oxide semiconductor layer;
    processing the passivation layer by a patterning process, and forming a pattern of via holes of the passivation layer over the drain electrodes; and
    forming pixel electrodes over the passivation layer, which are electrically connected to the drain electrodes through the via holes of the passivation layer.

11. The method according to claim 2, wherein a thickness of the photoresist in the photoresist totally-reserved area is within a range from 1 µm to 4 µm.

12. The method according to claim 2, wherein a thickness of the photoresist in the photoresist partially-reserved area is within a range from 0.5 μm to 2 μm.

13. An oxide thin film transistor (TFT) array substrate manufactured by the method according to claim 1.

14. A display device at least comprising the oxide thin film transistor (TFT) array substrate according to claim 13.

15. The method according to claim 2, wherein before the step of forming a pattern of an oxide semiconductor layer on the substrate, the method further comprises:
  forming gate electrodes on the substrate; and
  forming a gate insulating layer over the gate electrodes.

16. The method according to claim 2, wherein after the step of forming a source-drain metal layer on the pattern of the oxide semiconductor layer, forming patterns that include source electrodes and drain electrodes by an etching process, and removing the photoresist reserved on the channel regions in the pattern of the oxide semiconductor layer, the method further comprises:
  forming a passivation layer over the source electrodes, the drain electrodes and the channel regions in the pattern of the oxide semiconductor layer;
  processing the passivation layer by a patterning process, and forming a pattern of via holes of the passivation layer over the drain electrodes; and
  forming pixel electrodes over the passivation layer, which are electrically connected to the drain electrodes through the via holes of the passivation layer.

17. The method according to claim 3, wherein before the step of forming a pattern of an oxide semiconductor layer on the substrate, the method further comprises:
  forming gate electrodes on the substrate; and
  forming a gate insulating layer over the gate electrodes.

18. The method according to claim 3, wherein after the step of forming a source-drain metal layer on the pattern of the oxide semiconductor layer, forming patterns that include source electrodes and drain electrodes by an etching process, and removing the photoresist reserved on the channel regions in the pattern of the oxide semiconductor layer, the method further comprises:
  forming a passivation layer over the source electrodes, the drain electrodes and the channel regions in the pattern of the oxide semiconductor layer;
  processing the passivation layer by a patterning process, and forming a pattern of via holes of the passivation layer over the drain electrodes; and
  forming pixel electrodes over the passivation layer, which are electrically connected to the drain electrodes through the via holes of the passivation layer.

19. The method according to claim 3, wherein a thickness of the photoresist in the photoresist totally-reserved area is within a range from 1 μm to 4 μm.

20. The method according to claim 3, wherein a thickness of the photoresist in the photoresist partially-reserved area is within a range from 0.5 μm to 2 μm.

21. The method according to claim 2, wherein a thickness of the photoresist at the photoresist totally-reserved area is greater than a thickness of the photoresist at the photoresist partially-reserved area.

* * * * *